US 8,856,632 B2

(12) United States Patent
Hann et al.

(10) Patent No.: US 8,856,632 B2
(45) Date of Patent: Oct. 7, 2014

(54) METHOD AND A DEVICE FOR CONTROLLING FREQUENCY SYNCHRONIZATION

(75) Inventors: Kenneth Hann, Espoo (FI); Mikko Laulainen, Helsinki (FI)

(73) Assignee: Tellabs Oy, Espoo (FI)

( * ) Notice: Subject to any disclaimer, the term of this patent is extended or adjusted under 35 U.S.C. 154(b) by 342 days.

(21) Appl. No.: 13/422,333

(22) Filed: Mar. 16, 2012

(65) Prior Publication Data

US 2012/0254677 A1   Oct. 4, 2012

(30) Foreign Application Priority Data

Apr. 4, 2011   (FI) .................................... 20115322

(51) Int. Cl.
| | | |
|---|---|---|
| *G06F 11/00* | (2006.01) | |
| *H04J 3/06* | (2006.01) | |
| *H04L 7/00* | (2006.01) | |
| *H04L 7/033* | (2006.01) | |
| *H03L 7/08* | (2006.01) | |

(52) U.S. Cl.
CPC . *H04L 7/033* (2013.01); *H03L 7/08* (2013.01)
USPC ............ 714/798; 370/503; 375/355; 375/362

(58) Field of Classification Search
CPC ............ G01R 29/18; G01R 31/31726; G01R 31/31727; G06F 11/1658; G06F 11/3632; G11C 29/56012; H03L 7/08; H04L 7/0008; H04L 7/02; H04L 7/033
USPC ............ 714/744, 798; 370/503; 375/355, 362
See application file for complete search history.

(56) References Cited

U.S. PATENT DOCUMENTS

| | | | |
|---|---|---|---|
| 5,864,315 A | | 1/1999 | Welles et al. |
| 6,104,915 A | * | 8/2000 | Zhang et al. ..................... 455/76 |
| 6,304,582 B1 | * | 10/2001 | Zhang et al. .................. 370/503 |
| 6,831,523 B1 | * | 12/2004 | Pastorello et al. .............. 331/25 |

(Continued)

FOREIGN PATENT DOCUMENTS

| | | |
|---|---|---|
| EP | 0370170 A2 | 5/1990 |
| EP | 0272938 B1 | 11/1994 |

(Continued)

OTHER PUBLICATIONS

Kai-Wei Hong; Kuo-Hsing Cheng; Chi-Hsiang Chen; Jen-Chieh Liu; Chien-Cheng Chen, "A loading effect insensitive and high precision clock synchronization circuit," ESSCIRC, 2010 Proceedings of the , vol., No., pp. 514,517, Sep. 14-16, 2010.*

(Continued)

*Primary Examiner* — Cynthia Britt
(74) *Attorney, Agent, or Firm* — Young & Thompson

(57) ABSTRACT

A device for controlling frequency synchronization includes a processor for controlling a phase-controlled clock signal to achieve phase-locking with a reference clock signal, and for controlling a frequency-controlled clock signal so as to achieve frequency-locking with the reference clock signal. The processor is also configured to monitor a deviation between the frequency and phase-controlled clock signals, detect a change of circumstances such as temperature changes causing frequency drifting of the frequency-controlled clock signal, and replace or correct the frequency-controlled clock signal with, or on the basis of, the phase-controlled clock signal when both the monitored deviation and the detected change of circumstances show correlation confirming frequency drift of the frequency-controlled clock signal.

28 Claims, 2 Drawing Sheets

(56) References Cited

U.S. PATENT DOCUMENTS

| | | | |
|---|---|---|---|
| 6,917,658 B2 * | 7/2005 | Fernald | 375/355 |
| 7,015,762 B1 * | 3/2006 | Nicholls et al. | 331/10 |
| 7,586,382 B2 | 9/2009 | Wang et al. | |
| 7,876,790 B2 | 1/2011 | Cho et al. | |
| 8,611,485 B2 * | 12/2013 | Hann et al. | 375/362 |
| 2008/0316996 A1 | 12/2008 | Hatala | |
| 2009/0225743 A1 | 9/2009 | Nicholls et al. | |
| 2010/0166130 A1 | 7/2010 | Rahbar | |

FOREIGN PATENT DOCUMENTS

| | | | |
|---|---|---|---|
| WO | 0111781 A1 | 2/2001 | |
| WO | 2010002330 A1 | 1/2010 | |
| WO | 2010083930 A1 | 7/2010 | |

OTHER PUBLICATIONS

Mendel, S.; Vogel, C.; Da Dalt, N., "A Phase-Domain All-Digital Phase-Locked Loop Architecture Without Reference Clock Retiming," Circuits and Systems II: Express Briefs, IEEE Transactions on , vol. 56, No. 11, pp. 860,864, Nov. 2009.*

Shinn-Yan Lin, "A phase locked mechanism for time scaling frequency control system," Frequency Control Symposium and Exposition, 2004. Proceedings of the 2004 IEEE International , vol., No., pp. 478,481, Aug. 23-27, 2004.*

Extended European Search Report dated Jul. 13, 2012, from corresponding EP application.

Finnish Search Report, dated Dec. 7, 2011, from corresponding Finnish application.

* cited by examiner

METHOD AND A DEVICE FOR CONTROLLING FREQUENCY SYNCHRONIZATION

FIELD OF THE INVENTION

The invention relates to a method and a control device for controlling frequency synchronization. Furthermore, the invention relates to a computer program for controlling frequency synchronization. Furthermore, the invention relates to network element, e.g. a router or a switch, of a data transfer network.

BACKGROUND

Data transfer networks include network elements such as, for example, routers, switches, and terminal devices which communicate with each other via data transfer links between the network elements. In many data transfer networks, there is a need to achieve synchronization between clock signals prevailing at various network elements of a data transfer network. The network elements can be configured to constitute master-slave pairs in order to distribute timing information within a data transfer network. Each slave network element controls its clock signal generator so that a reference clock signal prevailing at the corresponding master network element is regenerated in the slave network element on the basis of timing messages transferred from the master network element to the slave network element. The timing messages can be time-stamps contained by protocol data units "PDU" that can be, for example, data packets or data frames. Each time-stamp indicates the instantaneous time value at the transmission moment of the respective protocol data unit containing the time-stamp under consideration, where the time value is based on the reference clock signal available at the master network element. It is also possible that the timing messages are timing packets that are transmitted so that the time interval between transmission moments of two successive timing packets is constant, or otherwise known, when being measured with the reference clock signal available at the master network element. It is also possible that one or more time-stamps indicating the transmission moments of one or more timing messages are transferred in one or more data packets transmitted after the one or more timing messages.

In many cases, the synchronization between network elements is accomplished as phase synchronization in which phase-error indicators are formed on the basis of reception moments of timing messages transmitted in accordance with the reference clock signal, and a phase-controlled clock signal is controlled in accordance with the phase-error indicators so as to achieve phase-locking between the reference clock signal and the phase-controlled clock signal. The phase-controlled clock signal is, however, susceptible to disturbances caused by the transfer delay variation of the timing messages. Thus, the weakness of this approach is that it tends to over-react to certain transfer delay variation characteristics. For example, 24 hours network loading patterns and/or large changes in the delay variation may cause problems in certain technologies such as, for example, asymmetric digital subscriber loops "ADSL", microwave radios, and Gigabit passive optical networks "GPON".

In conjunction with certain applications, e.g. the mobile $3^{rd}$ generation "mobile 3G" and the succeeding Long Term Evolution "LTE" technologies, there is no phase error accumulation limit, thus phase synchronization is not an absolute requirement but the frequency synchronization is sufficient. On the other hand, modern oven controlled crystal oscillators "OCXO" are capable of producing a stable clock signal and also the cost/performance ratio of OCXOs is continuously improving. Therefore, instead of using the phase synchronization that is susceptible to disturbances caused by the transfer delay variation, a better result can be achieved by using a high-quality OCXO and frequency synchronization with a sufficiently long update interval that the adverse effect of the transfer delay variation can be reduced. However, this kind of synchronization arrangement is quite slow or even unable to respond to, for example, changes in the temperature of the OCXO and/or other changes in local circumstances.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention there is provided a new method for controlling frequency synchronization. The method comprises:
  forming phase-error indicators on the basis of first values of reception moments of timing messages transmitted in accordance with a reference clock signal, the first values of the reception moments being expressed as time values based on a phase-controlled clock signal,
  controlling the phase-controlled clock signal with the phase-error indicators so as to achieve phase-locking between the reference clock signal and the phase-controlled clock signal,
  forming frequency-error indicators on the basis of second values of the reception moments of the timing messages, the second values of the reception moments being expressed as time values based on a frequency-controlled clock signal,
  controlling the frequency-controlled clock signal with the frequency-error indicators so as to achieve frequency-locking between the reference clock signal and the frequency-controlled clock signal,
  monitoring a deviation between the frequency-controlled clock signal and the phase-controlled clock signal,
  detecting, on the basis of a quantity measured from the system generating the frequency-controlled clock signal, a change of circumstances tending to cause frequency drifting of the frequency-controlled clock signal, and
  replacing or correcting the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

Thus, in the above-described method, the phase-controlled clock signal is used together with the information about possible changes in the circumstances, e.g. temperature changes, for improving the quality of the frequency-controlled clock signal.

The quantity measured from a system generating the frequency-controlled clock signal can be indicative of, for example, the internal and/or ambient temperature of an oscillator of the system generating the frequency-controlled clock signal or of fluctuations of supply voltage of the system generating the frequency-controlled clock signal. The need to correct the frequency-controlled clock signal can be indicated, for example, by a phase difference between the phase- and frequency-controlled clock signals and/or by a difference between control signals determining the frequencies of the phase- and frequency-controlled clock signals. In the event where exceeding of a monitoring limit of the above-mentioned phase difference correlates with a recent temperature change, and especially if also any other potentially available positive or negative frequency-offset probability indications, e.g. voltage fluctuations, etc., support the need for making corrective frequency adjustments to the frequency-controlled clock signal, the phase-controlled clock signal can be at least temporarily used instead of the frequency-controlled clock signal, or a slight temperature compensation can be performed to the frequency of the frequency-controlled clock signal. One example of a negative frequency-offset indication is that if the phase difference monitoring result exceeds such a rate-of-change threshold which cannot be explained by a measured temperature change, this indicates transfer delay variation noise and the frequency controlled clock signal is not replaced with the phase-controlled clock signal nor corrected on the basis of the phase controlled clock signal. However, if the frequency of the reference clock signal has changed, the reference clock signal and the frequency-controlled clock signal would still continue to diverge, in which case the phase-controlled clock signal is advantageously used for achieving convergence in the new situation.

In accordance with the second aspect of the invention there is provided a new control device for controlling frequency synchronization. The control device comprises a processor configured to:

form phase-error indicators on the basis of first values of reception moments of timing messages transmitted in accordance with a reference clock signal, the first values of the reception moments being expressed as time values based on a phase-controlled clock signal, form frequency-error indicators on the basis of second values of the reception moments of the timing messages, the second values of the reception moments being expressed as time values based on a frequency-controlled clock signal, control the phase-controlled clock signal with the phase-error indicators so as to achieve phase-locking between the reference clock signal and the phase-controlled clock signal, control the frequency-controlled clock signal with the frequency-error indicators so as to achieve frequency-locking between the reference clock signal and the frequency-controlled clock signal, monitor a deviation between the frequency-controlled clock signal and the phase-controlled clock signal, detect, on the basis of a quantity measured from the system generating the frequency-controlled clock signal, a change of circumstances tending to cause frequency drifting of the frequency-controlled clock signal, and replace or correct the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

In accordance with the third aspect of the invention there is provided a new network element. The network element comprises:

at least one ingress port for receiving timing messages, a controllable clock signal generator for producing a first controllable clock signal and a second controllable clock signal, the network element being arranged to operate in accordance with the second controllable clock signal, and a control device according to an embodiment of the invention for controlling the clock signal generator so that the first controllable clock signal is the phase-controlled clock signal and the second controllable clock signal is the frequency-controlled clock signal.

In accordance with the fourth aspect of the invention there is provided a new computer program for controlling frequency synchronization. The computer program comprises computer executable instructions for controlling a programmable processor to:

form phase-error indicators on the basis of first values of reception moments of timing messages transmitted in accordance with a reference clock signal, the first values of the reception moments being expressed as time values based on a phase-controlled clock signal, form frequency-error indicators on the basis of second values of the reception moments of the timing messages, the second values of the reception moments being expressed as time values based on a frequency-controlled clock signal, control the phase-controlled clock signal with the phase-error indicators so as to achieve phase-locking between the reference clock signal and the phase-controlled clock signal, control the frequency-controlled clock signal with the frequency-error indicators so as to achieve frequency-locking between the reference clock signal and the frequency-controlled clock signal, monitor a deviation between the frequency-controlled clock signal and the phase-controlled clock signal, detect, on the basis of a quantity measured from the system generating the frequency-controlled clock signal, a change of circumstances tending to cause frequency drifting of the frequency-controlled clock signal, and replace or correct the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

A computer program product according to the invention comprises a non-volatile computer readable medium, e.g. a compact disc ("CD"), encoded with a computer program according to the invention.

A number of exemplifying embodiments of the invention are described in accompanied dependent claims.

Various exemplifying embodiments of the invention both as to constructions and to methods of operation, together with additional objects and advantages thereof, will be best understood from the following description of specific exemplifying embodiments when read in connection with the accompanying drawings.

The verb "to comprise" is used in this document as an open limitation that neither excludes nor requires the existence of also un-recited features. The features recited in depending claims are mutually freely combinable unless otherwise explicitly stated.

BRIEF DESCRIPTION OF FIGURES

The exemplifying embodiments of the invention and their advantages are explained in greater detail below with reference to the accompanying drawings, in which.

DESCRIPTION OF EXEMPLIFYING EMBODIMENTS

Figure 1:
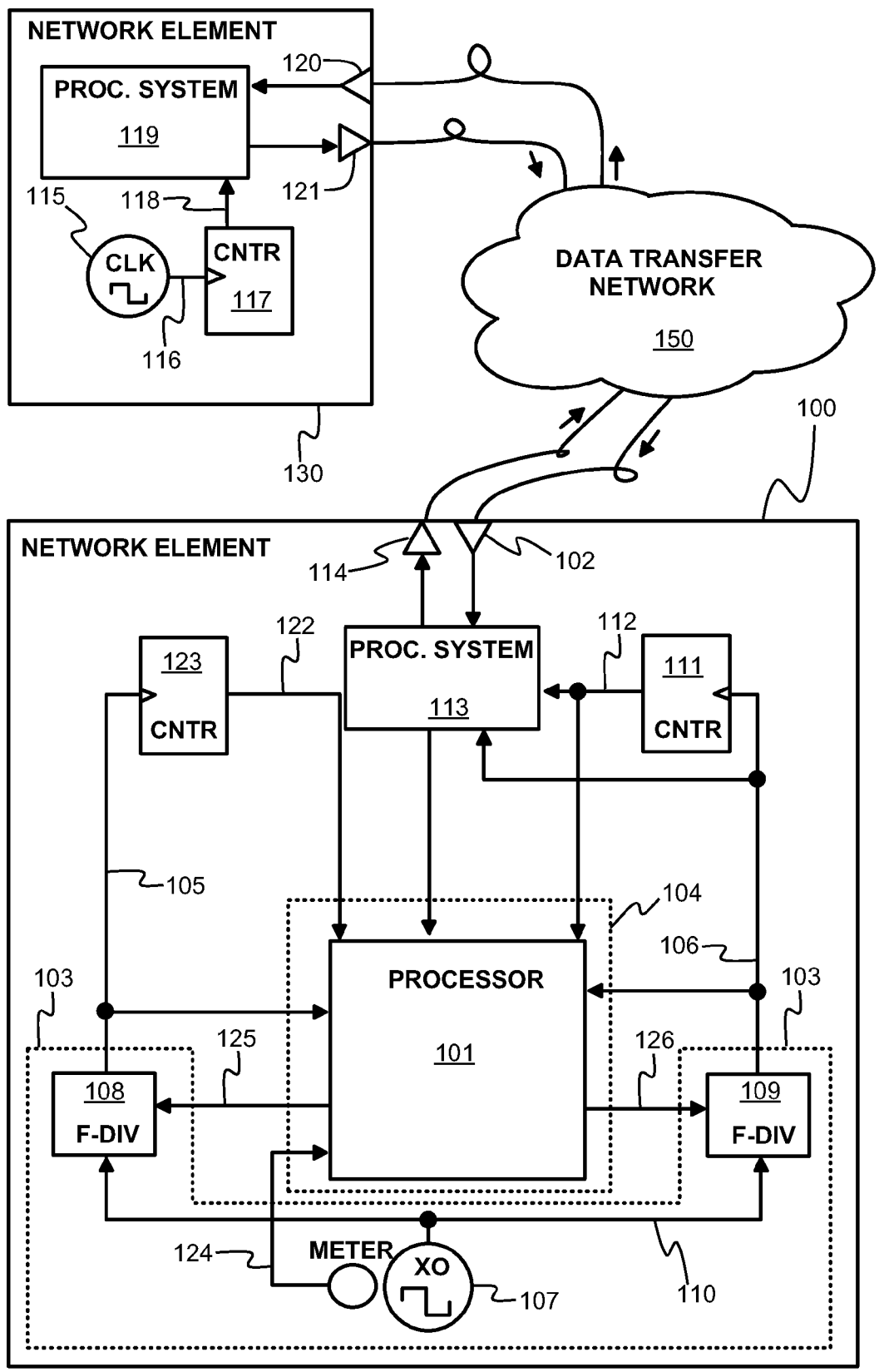
FIG. 1 shows a schematic illustration of an exemplifying data transfer system comprising a network element which is provided with a control device according to an embodiment of the invention for controlling frequency synchronization.

FIG. 1 shows a schematic illustration of an exemplifying data transfer system that comprises a network element 100 and a network element 130. The network elements 100 and 130 are connected to each other via a data transfer network 150 that may comprise several other network elements interconnected to each other via data transfer links. Each network element can be, for example, an Internet Protocol ("IP") router, an Ethernet switch, and/or a MultiProtocol Label Switching ("MPLS") switch. The network element 130 operates as a master network element and it is arranged to transmit timing messages to the network element 100 that operates as a slave network element. The network element 130 comprises a clock signal generator 115 arranged to generate a reference clock signal 116. The network element 130 comprises a counter 117 arranged to generate a signal 118 that represents the clock time prevailing at the network element 130. The network element 130 is arranged to transmit the timing messages in accordance with the reference clock signal 116. The network element 130 comprises a processing system 119 for performing control- and forwarding plane operations related to the data transfer protocols being used, e.g. IP, Ethernet, and/or MPLS. Furthermore, the network element 130 comprises at least one ingress port 120 and at least one egress port 121 for connecting to the data transfer network 150. The network element 100 comprises a controllable clock signal generator 103 for generating controllable clock signals. The network element 100 comprises a counter 111 arranged to generate a signal 112 that represents the clock time prevailing at the network element 100. The network element 100 comprises a processing system 113 for performing control- and forwarding plane operations related to data transfer protocols being used. Furthermore, the network element 100 comprises at least one ingress port 102 and at least one egress port 114 for connecting to the data transfer network 150.

The network element 100 comprises a control device 104 according to an embodiment of the invention for controlling the clock signal generator 103. The control device 104 comprises a processor 101 configured to form phase-error indicators on the basis of first values of reception moments of the timing messages received at the ingress port 102. The first values of the reception moments are expressed as time values based on a phase-controlled clock signal 105 that is a first controllable clock signal generated by the controllable clock signal generator 103. The above-mentioned first values of the reception moments are instantaneous values of a signal 122 at the reception times of the timing messages. The signal 122 is an output signal of a counter 123 that is driven by the phase-controlled clock signal 105. The processor 101 is configured to control the phase-controlled clock signal 105 with the phase-error indicators so as to achieve phase-locking between the reference clock signal 116 and the phase-controlled clock signal 105. The processor 101 is configured to form frequency-error indicators on the basis of second values of the reception moments of the timing messages. The second values of the reception moments are expressed as time values based on a frequency-controlled clock signal 106 that is a second controllable clock signal generated by the controllable clock signal generator 103. The above-mentioned second values of the reception moments are instantaneous values of the signal 112 at the reception times of the timing messages. The processor 101 is configured to control the frequency-controlled clock signal 106 with the frequency-error indicators so as to achieve frequency-locking between the reference clock signal 116 and the frequency-controlled clock signal 106.

In a control device according to an embodiment of the invention, the processor 101 is configured, for the purpose of forming each of the phase-error indicators, to calculate a difference between the first value of the reception moment of the respective timing message and a time-stamp value delivered from the network element 130 to the network element 100 and related to this timing message. In a case in which the timing messages are sent at a constant or otherwise pre-determined rate, it is not necessary to use the time-stamps delivered from the network element 130 to the network element 100, but values generated in the network element 100 and spaced at constant or otherwise pre-determined intervals can be used as ideal reception moments that are compared with the first values of the reception moments of the timing messages so as to form the phase-error indicators.

In a control device according to an embodiment of the invention, the processor 101 is configured, for the purpose of forming each of the frequency-error indicators, to calculate a first quantity $T_2-T_1$ that is a difference between the second values of the reception moments of such two timing messages which have experienced a substantially similar transfer delay. The processor 101 is configured to calculate a second quantity $T'_2-T'_1$ that is a difference of time-stamp values delivered from the network element 130 to the network element 100 and related to these two timing messages. The processor 101 is configured to calculate a difference $(T_2-T_1)-(T'_2-T'_1)$ between the first and second quantities. This difference is indicative of the frequency difference between the frequency-controlled clock signal 106 and the reference clock signal 116, because $T_2-T_1$ is the length of a first time interval measured with the frequency-controlled clock signal 106 and $T'_2-T'_1$ is the length of a second time interval measured with the reference clock signal and the real lengths of the first and second time intervals are substantially equal because the above-mentioned two timing messages have experienced a substantially similar transfer delay from the network element 130 to the network element 100. In a control device according to another embodiment of the invention, the processor 101 is configured, for the purpose of forming each of the frequency-error indicators, to calculate a first quantity $T_2-T_1$ that is the difference between the second values of the reception moments of such two timing messages which have experienced a substantially similar transfer delay, calculate a second quantity $T''_2-T''_1$ that is a difference of ideal reception moments of these two timing messages, and calculate a difference $(T_2-T_1)-(T''_2-T''_1)$ between the first and second quantities. The ideal reception moments of the timing messages are values generated in the network element 100 and spaced at equal or otherwise pre-determined intervals so that a difference between any two successive ideal reception moments is constant or otherwise known. The two timing messages which have experienced a substantially similar transfer delay can be selected, for example, to be a first timing message that has, from among timing messages received within a first time window, the smallest estimated transfer delay and a second timing message that has, from among timing messages received within a second time window, the smallest estimated transfer delay. A timing message having the smallest difference as a signed value between the second value of the reception moment and a respective time-stamp value or an ideal reception moment can be defined to be the timing message having the smallest estimated transfer delay.

In the exemplifying case shown in FIG. 1, the controllable clock signal generator 103 comprises a crystal oscillator 107, a first numerically controllable frequency divider 108 for producing the phase-controlled clock signal 105 from an output signal 110 of the crystal oscillator, and a second numerically controllable frequency divider 109 for producing the frequency-controlled clock signal 106 from the output signal of the crystal oscillator. The crystal oscillator 107 is preferably an oven controlled crystal oscillator "OCXO" that is capable of producing a stable clock signal. The numerically controllable frequency dividers 108 and 109 can be, for example, fractional N/N+1 dividers which are capable of producing a frequency division ratio N+$\epsilon$, where $\epsilon$ can be from zero to one depending on a control signal 125 or 126. Both the poll and update intervals in the frequency control of the frequency-controlled clock signal 106 can be large when a stable OCXO is used. The time period between two timing messages which are used for the frequency control can be even 24 hours. This time interval can, however, involve several intermediate polls for stability checking purposes. The frequency changing rate, Hz/sec, in the frequency control is preferably limited to e.g. twice the maximum value specified by the manufacturer for the frequency-drift due to the aging of the OXCO. The gain and other parameters of the resulting closed frequency control loop are advantageously selected so that the control loop is heavily damped, i.e. there are no overshoots in the step response. The update interval of the phase-control of the phase-controlled clock signal 105 is preferably significantly shorter, e.g. by a factor of tens, hundreds or even thousands compared with that of the frequency control.

It is also possible that the controllable clock signal generator 103 comprises a first voltage controlled oscillator "VCO" for producing the phase-controlled clock signal 105, and a second voltage controlled oscillator for producing the frequency-controlled clock signal 106.

The network element 100 comprises means for measuring from a system generating the frequency-controlled clock signal 106, i.e. from the controllable clock signal generator 103, a quantity 124 which is indicative of the stability of the frequency-controlled clock signal 106. The network element 100 may comprise, for example, a temperature sensor for measuring an internal and/or ambient temperature of the crystal oscillator 107. In addition to or instead of the information about the internal and/or ambient temperature of the crystal oscillator, the measured quantity 124 may contain, for example, information about the fluctuations of the supply voltage and/or the current consumption of the crystal oscillator. In conjunction with certain types of oscillators, changes in the current consumption may indicate a risk that temperature of the crystal oscillator has varied.

The processor 101 is configured to monitor a deviation between the frequency-controlled clock signal 106 and the phase-controlled clock signal 105. In an embodiment of the invention, the processor is configured, for the purpose of monitoring the deviation, to calculate a difference between the first control signal 125 determining the frequency of the phase-controlled clock signal and the second control signal 126 determining the frequency of the frequency-controlled clock signal. In another embodiment of the invention, the processor is configured, for the purpose of monitoring the deviation, to compare the instantaneous phase of the phase-controlled clock signal 105 to the instantaneous phase of the frequency-controlled clock signal 106. The processor 101 is configured to detect, on the basis of the measured quantity 124, a change of local circumstances tending to cause frequency drifting of the frequency-controlled clock signal 106. For example, a change in the internal and/or ambient temperature of the crystal oscillator 107 is an indication of a possible frequency drift on the frequency-controlled clock signal.

The processor 101 is configured to replace or correct the frequency-controlled clock signal 106 with or on the basis of the phase-controlled clock signal 106 in response to a situation in which both the monitored deviation between the frequency- and phase-controlled clock signals and the detected change of the local circumstances show correlation confirming frequency drift of the frequency-controlled clock signal, i.e. the measured quantity 124 and the monitored deviation unanimously indicate a change in the operation of the crystal oscillator 107. Thus, the phase-controlled clock signal 105 is used together with the information about possible changes in the circumstances, e.g. temperature changes, for improving the quality of the frequency-controlled clock signal 106. An exemplifying case where the phase-controlled clock signal is not necessarily used for correcting or replacing the frequency-controlled clock signal is a situation in which rapid transfer delay variations have been detected. The transfer delay variations degrade the quality of the phase-controlled clock signal and therefore it is not advisable to replace or correct the frequency-controlled clock signal with or on the basis of the phase-controlled clock signal. Another exemplifying case where the phase-controlled clock signal is not necessarily used for correcting or replacing the frequency-controlled clock signal is a situation in which the rate-of-change of the phase difference between the phase- and frequency-controlled clock signals is so high that it cannot be explained by a measured temperature change. This indicates transfer delay variation noise that degrades the quality of the phase-controlled clock signal and thus it is not advisable to replace or correct the frequency-controlled clock signal with or on the basis of the phase-controlled clock signal. However, if the frequency of the reference clock signal 116 has changed, the reference clock signal and the frequency-controlled clock signal would still continue to diverge, in which case the phase-controlled clock signal is advantageously used for achieving convergence in the new situation. In addition to using the phase-controlled clock signal for replacing or correcting the frequency-controlled clock signal during the normal operation of the network element 100, the phase-controlled clock signal can be used at the beginning of the operation of the network element 100 for providing initial synchronization during a starting phase and in cases in which a master network element has been changed.

In a control device according to an embodiment of the invention, the processor 101 is configured to determine, on the basis of the measured quantity 124, an estimate for a maximum rate of the frequency drifting of the frequency-controlled clock signal that is in concordance with the change of the circumstances e.g. a change of temperature. The processor is configured to limit the rate of frequency change of the frequency-controlled clock signal in accordance with the estimate when correcting the frequency-controlled clock signal on the basis of the phase-controlled clock signal.

In a control device according to an embodiment of the invention, the processor 101 is configured to store into a memory device information about measured internal and/or ambient temperatures of the crystal oscillator 107 and corresponding frequency adjustments that, according to the phase-controlled clock signal 105, are to be made to the frequency-controlled clock signal 106.

In a control device according to an embodiment of the invention, the processor 101 is configured, for the purpose of correcting the frequency-controlled clock signal 106, to change the frequency of the frequency-controlled clock signal towards the frequency of the phase-controlled clock signal 105 with a pre-stored value chosen on the basis of the measured change of the internal and/or ambient temperature of the crystal oscillator 107. Hence, the measured temperature determines the magnitude of the frequency adjustment and the phase-controlled clock signal determines the direction of the frequency adjustment, i.e. increase or decrease the frequency of the frequency controlled clock signal. At the beginning of the operation, the pre-stored values can be based on the manufacturer's specifications of the crystal oscillator. Later, the pre-stored values can be adjusted on the basis of measured internal and/or ambient temperatures of the crystal oscillator and corresponding frequency adjustments that, according to the phase-controlled clock signal, are to be made to the frequency-controlled clock signal. Appropriate filtering or other methods for removing disturbances are advantageously used when adjusting the pre-stored values.

In the exemplifying case illustrated in FIG. 1, the control device 104 is a part of a network element 100. It is also possible that the control device is a separate apparatus that is connected to the network element. The processor 101 of the control device may comprise one or more programmable processor units, one or more dedicated hardware circuits such as an application specific integrated circuit "ASIC", one or more field programmable logic circuits such as a field programmable gate array "FPGA", or a combination of these.

Figure 2:
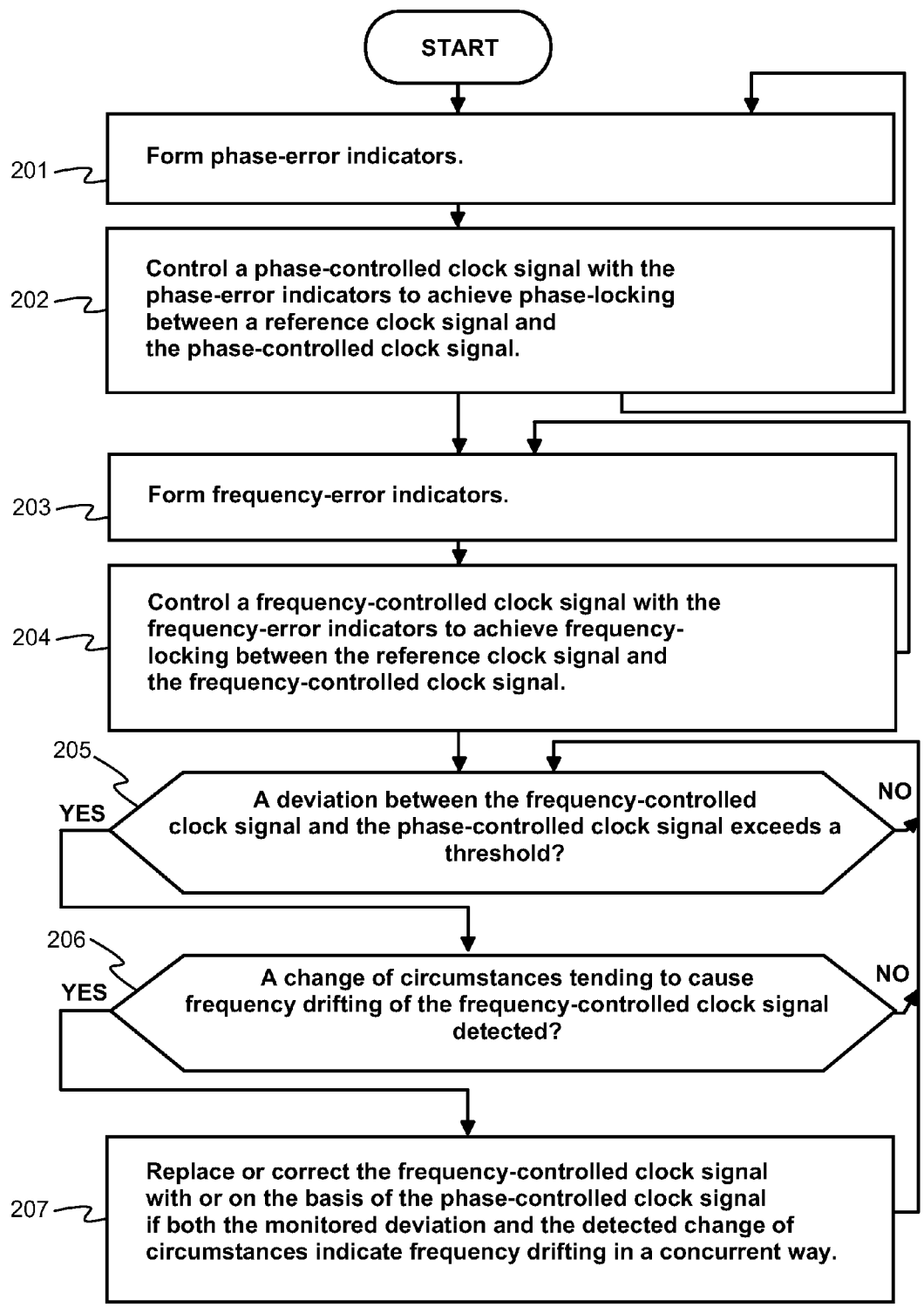
FIG. 2 shows a flow chart of a method according to an embodiment of the invention for controlling frequency synchronization.

FIG. 2 shows a flow chart of a method according to an embodiment of the invention for controlling frequency synchronization. The method comprises:

- in a phase 201, forming phase-error indicators on the basis of first values of reception moments of timing messages transmitted in accordance with a reference clock signal, the first values of the reception moments being expressed as time values based on a phase-controlled clock signal,
- in a phase 202, controlling the phase-controlled clock signal with the phase-error indicators so as to achieve phase-locking between the reference clock signal and the phase-controlled clock signal,
- in a phase 203, forming frequency-error indicators on the basis of second values of the reception moments of the timing messages, the second values of the reception moments being expressed as time values based on a frequency-controlled clock signal,
- in a phase 204, controlling the frequency-controlled clock signal with the frequency-error indicators so as to achieve frequency-locking between the reference clock signal and the frequency-controlled clock signal,
- in a phase 205, monitoring a deviation between the frequency-controlled clock signal and the phase-controlled clock signal,
- in a phase 206, detecting on the basis of a quantity measured from the system generating the frequency-controlled clock signal, a change of local circumstances tending to cause frequency drifting of the frequency-controlled clock signal, and
- in a phase 207, replacing or correcting the frequency-controlled clock signal with or on the basis of the phase-controlled clock signal in response to a situation in which both the monitored deviation between the frequency- and phase-controlled clock signals and the detected change of the local circumstances show correlation confirming frequency drift of the frequency-controlled clock signal.

A method according to an embodiment of the invention further comprises determining, on the basis of the measured quantity, an estimate for a maximum rate of the frequency drifting of the frequency-controlled clock signal that is in concordance with the change of the circumstances, and limiting the rate of frequency change of the frequency-controlled clock signal in accordance with the estimate when correcting the frequency-controlled clock signal on the basis of the phase-controlled clock signal.

A method according to an embodiment of the invention comprises, for the purpose of forming each of the phase-error indicators, calculating a difference between the first value of the reception moment of the respective timing message and a time-stamp value related to this timing message.

A method according to an embodiment of the invention comprises, for the purpose of forming each of the phase-error indicators, calculating a difference between the first value of the reception moment of the respective timing message and an ideal reception moment of this timing message. The ideal reception moments of the timing messages are spaced at equal or otherwise known intervals so that a difference between any two successive ideal reception moments is constant or otherwise known.

A method according to an embodiment of the invention comprises, for the purpose of forming each of the frequency-error indicators, calculating a first quantity that is a difference between the second values of the reception moments of such two timing messages which have experienced a substantially similar transfer delay, calculating a second quantity that is a difference of time-stamp values related to these two timing messages, and calculating a difference between the first and second quantities. The above-mentioned two timing messages can be such timing messages which have, on the basis of the second values of their reception moments, smallest estimated transfer delays.

A method according to an embodiment of the invention comprises, for the purpose of forming each of the frequency-error indicators, calculating a first quantity that is a difference between the second values of the reception moments of such two timing messages which have experienced a substantially similar transfer delay, calculating a second quantity that is a difference of ideal reception moments of these two timing messages, and calculating a difference between the first and second quantities. The ideal reception moments of the timing messages are spaced at equal or otherwise known intervals so that a difference between any two successive ideal reception moments is constant or otherwise known. The above-mentioned two timing messages can be such timing messages which have, on the basis of the second values of their reception moments, smallest estimated transfer delays.

In a method according to an embodiment of the invention, the quantity measured from a system generating the frequency-controlled clock signal is indicative of at least an internal and/or ambient temperature of an oscillator of the system generating the frequency-controlled clock signal.

In a method according to an embodiment of the invention, the quantity measured from the system generating the frequency-controlled clock signal is indicative of at least changes of the supply voltage of an oscillator of the system generating the frequency-controlled clock signal.

In a method according to an embodiment of the invention, the quantity measured from the system generating the frequency-controlled clock signal is indicative of at least changes of current consumption of the oscillator of the system generating the frequency-controlled clock signal.

A method according to an embodiment of the invention comprises, for the purpose of monitoring the deviation between the frequency-controlled clock signal and the phase-controlled clock signal, calculating a difference between a first control signal determining the frequency of the phase-controlled clock signal and a second control signal determining the frequency of the frequency-controlled clock signal.

A method according to an embodiment of the invention comprises, for the purpose of monitoring the deviation between the frequency-controlled clock signal and the phase-controlled clock signal, comparing the phase of the phase-controlled clock signal to the phase of the frequency-controlled clock signal.

A method according to an embodiment of the invention comprises, for the purpose of correcting the frequency-controlled clock signal, changing the frequency of the frequency-controlled clock signal towards the frequency of the phase-controlled clock signal with a pre-stored value chosen on the basis of a change in the measured internal and/or ambient temperature of the oscillator of the system generating the frequency-controlled clock signal.

A computer program according to an embodiment of the invention comprises software modules for controlling frequency synchronization. The software modules comprise computer executable instructions for controlling the programmable processor to:
  form phase-error indicators on the basis of first values of reception moments of timing messages transmitted in accordance with a reference clock signal, the first values of the reception moments being expressed as time values based on a phase-controlled clock signal,
  form frequency-error indicators on the basis of second values of the reception moments of the timing messages, the second values of the reception moments being expressed as time values based on a frequency-controlled clock signal,
  control the phase-controlled clock signal with the phase-error indicators so as to achieve phase-locking between the reference clock signal and the phase-controlled clock signal,
  control the frequency-controlled clock signal with the frequency-error indicators so as to achieve frequency-locking between the reference clock signal and the frequency-controlled clock signal,
  monitor a deviation between the frequency-controlled clock signal and the phase-controlled clock signal,
  detect, on the basis of a quantity measured from the system generating the frequency-controlled clock signal, a change of local circumstances tending to cause frequency drifting of the frequency-controlled clock signal, and
  replace or correct the frequency-controlled clock signal with or on the basis of the phase-controlled clock signal in response to a situation in which both the monitored deviation between the frequency- and phase-controlled clock signals and the detected change of the local circumstances show correlation confirming frequency drift of the frequency-controlled clock signal.

The software modules can be, for example, subroutines and functions generated with a suitable programming language.

A computer program product according to an embodiment of the invention comprises a non-volatile computer readable medium, e.g. a compact disc ("CD"), encoded with the above-mentioned software modules.

A signal according to an embodiment of the invention is encoded to carry information defining a computer program according to an embodiment of the invention.

The specific examples provided in the description given above should not be construed as limiting. Therefore, the invention is not limited merely to the embodiments described above, many variants being possible.

What is claimed is:

1. A control device for controlling frequency synchronization, the control device comprising a processor configured to:
  form phase-error indicators on the basis of first values of reception moments of timing messages transmitted in accordance with a reference clock signal, the first values of the reception moments being expressed as time values based on a phase-controlled clock signal,
  form frequency-error indicators on the basis of second values of the reception moments of the timing messages, the second values of the reception moments being expressed as time values based on a frequency-controlled clock signal,
  control the phase-controlled clock signal with the phase-error indicators so as to achieve phase-locking between the reference clock signal and the phase-controlled clock signal,
  control the frequency-controlled clock signal with the frequency-error indicators so as to achieve frequency-locking between the reference clock signal and the frequency-controlled clock signal,
  monitor a deviation between the frequency-controlled clock signal and the phase-controlled clock signal,
  detect, on the basis of a quantity measured from a system generating the frequency-controlled clock signal, a change of circumstances tending to cause frequency drifting of the frequency-controlled clock signal, and
  replace or correct the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

2. The control device according to claim 1, wherein the processor is further configured to determine, on the basis of the measured quantity, an estimate for a maximum rate of the frequency drifting of the frequency-controlled clock signal that is in concordance with the change of the circumstances, and to limit the rate of frequency change of the frequency-controlled clock signal in accordance with the estimate when correcting the frequency-controlled clock signal on the basis of the phase-controlled clock signal.

3. The control device according to claim 1, wherein the processor is configured, for the purpose of forming each of the phase-error indicators, to calculate a difference between the first value of the reception moment of the respective timing message and a time-stamp value related to this timing message.

4. The control device according to claim 1, wherein the processor is configured, for the purpose of forming each of the phase-error indicators, to calculate a difference between the first value of the reception moment of the respective timing message and an ideal reception moment of this timing message, the ideal reception moments of the timing messages being spaced at equal intervals so that a difference between any two successive ideal reception moments is constant.

5. The control device according to claim 1, wherein the processor is configured, for the purpose of forming each of the frequency-error indicators, to calculate a first quantity that is a difference between the second values of the reception moments of such two timing messages which have experienced a substantially similar transfer delay, calculate a second quantity that is a difference of time-stamp values related to these two timing messages, and calculate a difference between the first and second quantities.

6. The control device according to claim 5, wherein the processor is configured to select the two timing messages to be such timing messages which have, on the basis of the second values of their reception moments, smallest estimated transfer delays.

7. The control device according to claim 1, wherein the processor is configured, for the purpose of forming each of the frequency-error indicators, to calculate a first quantity that is a difference between the second values of the reception moments of such two timing messages which have experienced a substantially similar transfer delay, calculate a second quantity that is a difference of ideal reception moments of these two timing messages, and calculate a difference between the first and second quantities, the ideal reception moments of the timing messages being spaced at equal intervals so that a difference between any two successive ideal reception moments is constant.

8. The control device according to claim 1, wherein the quantity measured from a system generating the frequency-controlled clock signal is indicative of at least an internal and/or ambient temperature of an oscillator of the system generating the frequency-controlled clock signal.

9. The control device according to claim 8, wherein the processor is configured, for the purpose of correcting the frequency-controlled clock signal, to change the frequency of the frequency-controlled clock signal towards the frequency of the phase-controlled clock signal with a pre-stored value chosen on the basis of a change in the measured internal and/or ambient temperature of the oscillator.

10. The control device according to claim 1, wherein the quantity measured from a system generating the frequency-controlled clock signal is indicative of at least one of the following: changes of supply voltage of an oscillator of the system generating the frequency-controlled clock signal, changes of current consumption of the oscillator.

11. The control device according to claim 1, wherein the processor is configured, for the purpose of monitoring the deviation between the frequency-controlled clock signal and the phase-controlled clock signal, to calculate a difference between a first control signal determining the frequency of the phase-controlled clock signal and a second control signal determining the frequency of the frequency-controlled clock signal.

12. The control device according to claim 1, wherein the processor is configured, for the purpose of monitoring the deviation between the frequency-controlled clock signal and the phase-controlled clock signal, to compare the phase of the phase-controlled clock signal to the phase of the frequency-controlled clock signal.

13. A network element comprising:
    at least one ingress port for receiving timing messages transmitted in accordance with a reference clock signal, and
    a controllable clock signal generator for producing a first controllable clock signal and a second controllable clock signal, the network element being arranged to operate in accordance with the second controllable clock signal,
wherein network element further comprises a control device for controlling the clock signal generator so that the first controllable clock signal is a phase-controlled clock signal and the second controllable clock signal is a frequency-controlled clock signal, the control device comprising a processor configured to:
    form phase-error indicators on the basis of first values of reception moments of the timing messages, the first values of the reception moments being expressed as time values based on the phase-controlled clock signal,
    form frequency-error indicators on the basis of second values of the reception moments of the timing messages, the second values of the reception moments being expressed as time values based on the frequency-controlled clock signal,
    control the phase-controlled clock signal with the phase-error indicators so as to achieve phase-locking between the reference clock signal and the phase-controlled clock signal,
    control the frequency-controlled clock signal with the frequency-error indicators so as to achieve frequency-locking between the reference clock signal and the frequency-controlled clock signal,
    monitor a deviation between the frequency-controlled clock signal and the phase-controlled clock signal,
    detect, on the basis of a quantity measured from the clock signal generator generating the frequency-controlled clock signal, a change of circumstances tending to cause frequency drifting of the frequency-controlled clock signal, and
    replace or correct the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

14. The network element according to claim 13, wherein the controllable clock signal generator comprises a crystal oscillator and a first numerically controllable frequency divider for producing the phase-controlled clock signal from an output signal of the crystal oscillator and a second numerically controllable frequency divider for producing the frequency-controlled clock signal from the output signal of the crystal oscillator.

15. The network element according to claim 13, wherein the network element is at least one of the following: an Internet Protocol ("IP") router, an Ethernet switch, a MultiProtocol Label Switching ("MPLS") switch.

16. A method for controlling frequency synchronization, the method comprising:
    forming phase-error indicators on the basis of first values of reception moments of timing messages transmitted in accordance with a reference clock signal, the first values of the reception moments being expressed as time values based on a phase-controlled clock signal,
    controlling the phase-controlled clock signal with the phase-error indicators so as to achieve phase-locking between the reference clock signal and the phase-controlled clock signal,
    forming frequency-error indicators on the basis of second values of the reception moments of the timing messages, the second values of the reception moments being expressed as time values based on a frequency-controlled clock signal,
    controlling the frequency-controlled clock signal with the frequency-error indicators so as to achieve frequency-locking between the reference clock signal and the frequency-controlled clock signal, monitoring a deviation between the frequency-controlled clock signal and the phase-controlled clock signal, detecting, on the basis of a quantity measured from a system generating the frequency-controlled clock signal, a change of circumstances tending to cause frequency drifting of the frequency-controlled clock signal, and replacing or correcting the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

17. The method according to claim 16, wherein the method further comprises determining, on the basis of the measured quantity, an estimate for a maximum rate of the frequency drifting of the frequency-controlled clock signal that is in concordance with the change of the circumstances, and limiting the rate of frequency change of the frequency-controlled clock signal in accordance with the estimate when correcting the frequency-controlled clock signal on the basis of the phase-controlled clock signal.

18. The method according to claim 16, wherein the method comprises, for the purpose of forming each of the phase-error indicators, calculating a difference between the first value of the reception moment of the respective timing message and a time-stamp value related to this timing message.

19. The method according to claim 16, wherein the method comprises, for the purpose of forming each of the phase-error indicators, calculating a difference between the first value of the reception moment of the respective timing message and an ideal reception moment of this timing message, the ideal reception moments of the timing messages being spaced at equal intervals so that a difference between any two successive ideal reception moments is constant.

20. The method according to claim 16, wherein the method comprises, for the purpose of forming each of the frequency-error indicators, calculating a first quantity that is a difference between the second values of the reception moments of such two timing messages which have experienced a substantially similar transfer delay, calculating a second quantity that is a difference of time-stamp values related to these two timing messages, and calculating a difference between the first and second quantities.

21. The method according to claim 20, wherein the method comprises selecting the two timing messages to be such timing messages which have, on the basis of the second values of their reception moments, smallest estimated transfer delays.

22. The method according to claim 16, wherein the method comprises, for the purpose of forming each of the frequency-error indicators, calculating a first quantity that is a difference between the second values of the reception moments of such two timing messages which have experienced a substantially similar transfer delay, calculating a second quantity that is a difference of ideal reception moments of these two timing messages, and calculating a difference between the first and second quantities, the ideal reception moments of the timing messages being spaced at equal intervals so that a difference between any two successive ideal reception moments is constant.

23. The method according to claim 16, wherein the quantity measured from a system generating the frequency-controlled clock signal is indicative of at least an internal and/or ambient temperature of an oscillator of the system generating the frequency-controlled clock signal.

24. The method according to claim 23, wherein the method comprises, for the purpose of correcting the frequency-controlled clock signal, changing the frequency of the frequency-controlled clock signal towards the frequency of the phase-controlled clock signal with a pre-stored value chosen on the basis of a change in the measured internal and/or ambient temperature of the oscillator.

25. The method according to claim 16, wherein the quantity measured from a system generating the frequency-controlled clock signal is indicative of at least one of the following: changes of supply voltage of an oscillator of the system generating the frequency-controlled clock signal, changes of current consumption of the oscillator.

26. The method according to claim 16, wherein the method comprises, for the purpose of monitoring the deviation between the frequency-controlled clock signal and the phase-controlled clock signal, calculating a difference between a first control signal determining the frequency of the phase-controlled clock signal and a second control signal determining the frequency of the frequency-controlled clock signal.

27. The method according to claim 16, wherein the method comprises, for the purpose of monitoring the deviation between the frequency-controlled clock signal and the phase-controlled clock signal, comparing the phase of the phase-controlled clock signal to the phase of the frequency-controlled clock signal.

28. A non-transitory computer readable medium encoded with a computer program for controlling frequency synchronization, the computer program comprising computer executable instructions for controlling a programmable processor to:

form phase-error indicators on the basis of first values of reception moments of timing messages transmitted in accordance with a reference clock signal, the first values of the reception moments being expressed as time values based on a phase-controlled clock signal, form frequency-error indicators on the basis of second values of the reception moments of the timing messages, the second values of the reception moments being expressed as time values based on a frequency-controlled clock signal, control the phase-controlled clock signal with the phase-error indicators so as to achieve phase-locking between the reference clock signal and the phase-controlled clock signal, control the frequency-controlled clock signal with the frequency-error indicators so as to achieve frequency-locking between the reference clock signal and the frequency-controlled clock signal, monitor a deviation between the frequency-controlled clock signal and the phase-controlled clock signal, detect, on the basis of a quantity measured from a system generating the frequency-controlled clock signal, a change of circumstances tending to cause frequency drifting of the frequency-controlled clock signal, and replace or correct the frequency-controlled clock signal with or on the basis of the phase-controlled clock signal in response to a situation in which both the monitored deviation between the frequency- and phase-controlled clock signals and the detected change of circumstances show correlation confirming frequency drift of the frequency-controlled clock signal.

* * * * *